United States Patent [19]

MacDonough

[11] 4,179,715

[45] Dec. 18, 1979

[54] ELECTRIC CIRCUIT FOR ACCESSORY FOR HOST TAPE RECORDER

[75] Inventor: Francis X. MacDonough, Penfield, N.Y.

[73] Assignee: Tapecon, Inc., Rochester, N.Y.

[21] Appl. No.: 894,530

[22] Filed: Apr. 10, 1978

[51] Int. Cl.² ............................................. G11B 5/12
[52] U.S. Cl. .................................... 360/61; 360/60; 360/62
[58] Field of Search ..................... 360/60, 61, 62, 63, 360/15, 17

[56] References Cited

U.S. PATENT DOCUMENTS

| | | | |
|---|---|---|---|
| 3,752,935 | 8/1973 | Iwawaki | 360/62 |
| 3,763,330 | 10/1973 | Fulwiler | 360/2 |
| 3,959,817 | 5/1976 | Honjo et al. | 360/62 |

Primary Examiner—Vincent P. Canney

Attorney, Agent, or Firm—Stonebraker, Shepard & Stephens

[57] ABSTRACT

Electric circuitry for an accessory for a host tape recorder and player automatically operates the accessory in the same mode selected for the host. The circuitry includes a recording amplifier for amplifying an information signal and means for generating a recording bias signal and applying both the information signal and the recording bias signal to a magnetic head in the accessory for tape recording. A playback amplifier receives a playback signal from the magnetic head in the accessory, amplifies this and transmits it to the host via the transducer. The circuitry also includes a switching circuitry for switching the accessory into the same mode of operation set for the host, and the switching circuitry is responsive to a bias portion of a recording signal from the host received via the transducer for switching the accessory to the record mode in response to presence of the bias portion of the recording signal and for otherwise switching the accessory into the playback mode.

12 Claims, 3 Drawing Figures

ELECTRIC CIRCUIT FOR ACCESSORY FOR HOST TAPE RECORDER

BACKGROUND OF THE INVENTION

U.S. Pat. No. 3,763,330 suggests an auxiliary device connectable to a cassette tape recorder by a cassette-shaped plug containing a transducer to allow electrical communication between the host and the auxiliary device. The auxiliary device can then record and play back from magnetic tapes on planar cards or some other tape recording medium different from the one used by the host. The auxiliary device has to be switched into the corresponding mode of the host so that both operate in either record or playback modes.

This invention involves recognition of a way for automatically switching an auxiliary or accessory device to a mode of operation corresponding to the mode of the host recorder/player so that an operator only has to press buttons or adjust switches on the host, and the auxiliary or accessory device automatically conforms to the mode of operation set for the host. This prevents any accidental mismatch between the host and the accessory, and makes the operation of these devices simpler and more convenient. The invention also aims at reliability, economy, and efficiency in circuitry for an accessory for a host tape recorder.

SUMMARY OF THE INVENTION

The invention applies to electric circuitry for an accessory for a host tape recorder and player, with the accessory having a magnetic head for tape recording and playback and an electromagnetic transducer for sending and receiving electric signals to and from the host recorder and player. The circuitry includes a recording amplifier arranged for amplifying an information signal and applying the amplified signal to the magnetic head for tape recording in the accessory. To facilitate this, the circuitry includes means for generating a recording bias signal and applying this to the magnetic head along with the amplified signal for tape recording in the accessory. The circuitry also includes a playback amplifier for receiving a playback signal from the magnetic head in the accessory, amplifying the playback signal, and applying the amplified playback signal to the transducer for transmission to the host recorder/player. The circuitry also includes switch means for switching the circuitry between a record mode and a playback mode, and the switch means activates the recording amplifier and generating means and deactivates the playback amplifier when the accessory is switched to the record mode and deactivates the recording amplifier and the generating means and activates the playback amplifier when the circuitry is switched to the playback mode. The switching means is responsive to a bias portion of a recording signal from the host for switching the accessory circuitry into the record mode when the bias portion of the recording signal from the host is received by the transducer and for switching the circuitry into the playback mode when the transducer is not receiving the bias portion of the recording signal from the host.

DRAWINGS

FIGS. 1 and 3 are schematic circuit diagrams of preferred embodiments of the inventive circuitry; and FIG. 2 is a schematic circuit diagram of another preferred embodiment of the inventive circuitry using integrated circuits.

DETAILED DESCRIPTION

Figure 1:
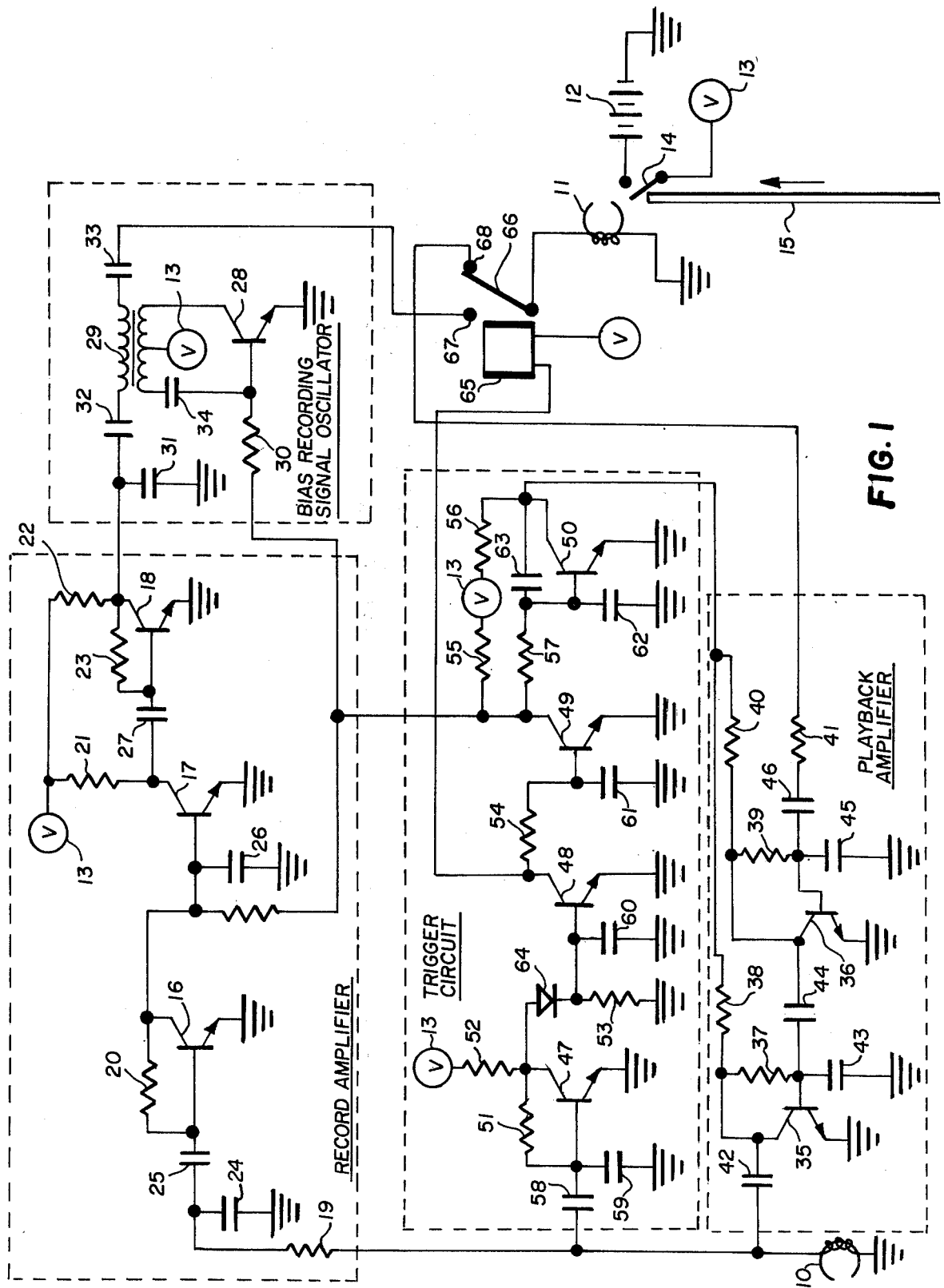

The preferred embodiment of circuitry shown in the drawings is applied to an accessory for a host tape recorder and player. The host machine can be any sort of tape recorder and player, including a cassette, mini-cassette, or 8-track tape recorder, a reel-to-reel tape recorder, a dictating machine, or a planar drive tape recorder. The accessory device using the inventive circuitry generally accomplishes tape recording and playback in a medium different from the one used by the host, although this is not essential. For example, the accessory can be a planar drive tape recorder and player, while the host uses some form of cassette or reel-to-reel tape, or the accessory can have a cassette or reel-to-reel tape drive different from the tape medium and drive used by the host. The accessory is preferably electrically connected to the host by a ribbon conductor connected to a transducer that plugs into the host machine as generally suggested in U.S. Pat. No. 3,763,330. In addition to a transducer for sending and receiving electric signals to and from the host recorder and player, the accessory has a magnetic head for tape recording and playback. The transducer electrically communicating with the host is preferably a magnetic head positioned gap-to-gap with the magnetic recording and playback head of the host machine. The invention can be applied to digital signals and the information portion of a recording signal can be audio, digital, or structured in any desired form to communicate a message.

As shown in FIG. 1, transducer 10 in electrical communication with the host machine is shown at the lower left, and magnetic head 11 for tape recording and playback in the accessory is shown at the right. A battery 12 provides an energizing voltage 13 that is applied to the circuitry at all the points 13 indicated by the letter V. A switch 14 is arranged for energizing the circuitry, and when the accessory operates with a planar drive for flat cards, switch 14 is preferably arranged in the region of magnetic head 11 to be closed by movement of a card 15 for energizing the circuitry whenever card 15 is passing by magnetic head 11.

Broken lines enclose four main components of the illustrated circuitry that are identified as "record amplifier", "bias recording signal oscillator", "trigger circuit", and "playback amplifier". The recording amplifier amplifies an information portion of a recording signal received from the host recorder/player via transducer 10 and applies the amplified signal to magnetic head 11 for recording in the accessory. The bias recording signal oscillator includes an oscillating transistor 28 arranged for generating a recording bias signal and applying this to magnetic head 11 along with the amplified signal from the recording amplifier for tape recording in the accessory. The playback amplifier is arranged for receiving a playback signal from magnetic head 11 and amplifying and applying the playback signal to transducer 10 for transmission to the host recorder/player for playback through a speaker. The trigger circuit includes switch means for switching the accessory circuitry between a record mode and a playback mode. The trigger circuit activates the recording amplifier and the bias recording signal oscillator and deactivates the playback amplifier when the accessory circuitry is switched into the record mode, and in the playback mode the trigger circuitry deactivates the recording amplifier and the bias recording signal oscillator and activates the playback amplifier.

The trigger circuitry is arranged to be responsive to a bias portion of the recording signal from the host recorder/player for switching the accessory circuitry into the record mode when the bias portion of the recording signal from the host is received by transducer 10 and for switching the accessory circuitry into the playback mode when transducer 10 is not receiving the bias portion of the recording signal from the host. Once the functional interrelationship of these components is fully understood, their electronic design is within the reach of ordinary skill in the art. The record amplifier includes transistors 16-18, resistors 19-23, and capacitors 24-27. The bias recording signal oscillator includes an oscillating transistor 28 applying a bias recording signal to a modulated audio signal passing through transformer 29, and the oscillator also includes a resistor 30 and capacitors 31-34. The playback amplifier includes transistors 35 and 36, resistors 37-41, and capacitors 42-46. The trigger circuit includes transistors 47-50, resistors 51-57, capacitors 58-63, and diode 64. Relay 65 is operated by the trigger circuit to position switch 66 between contacts 67 and 68 to establish the playback and record modes of operation for the illustrated circuitry as explained more fully below.

The automatic switching accomplished by the circuitry of FIG. 1 sets the accessory circuitry in record and playback modes corresponding with the mode of operation set for the host, and the switching is accomplished automatically without requiring any operator intervention. The recording signal received by transducer 10 when the host recorder/player is set in the record mode includes an information portion and a bias portion as is conventionally used in tape recording equipment. The present trend is to make the bias portion of the recording signal an AC signal having a frequency above 25 kHz and typically about 50 kHz to facilitate recording the information portion of the signal in a magnetic medium. The bias portion of the recording signal is received by transducer 10 along with the information portion of the recording signal from the host and is used to accomplish automatic switching while the information portion is used for recording.

The trigger circuit of the illustrated circuitry is dimensioned to respond to the presence or absence of the bias portion of the recording signal from the host so that transistor 48 conducts when the bias signal is present and does not conduct when the bias signal is absent. Conduction of transistor 48 energizes relay 65 to pull switch 66 against contact 67 to connect the record amplifier and the bias recording signal oscillator with magnetic head 11 for tape recording in the accessory. When transistor 48 does not conduct, switch 66 drops away to engage contact 68 and connect the playback amplifier with magnetic head 11. Capacitor 58 is dimensioned to pass the bias portion of the recording signal into the trigger circuit, but not pass the information portion of the recording signal that is amplified by the record amplifier and applied to magnetic head 11 for recording in the accessory. The bias recording signal oscillator generates and imposes a bias recording signal on the amplified audio signal at transformer 29 so that a bias signal is also applied to magnetic head 11 to facilitate tape recording in the accessory.

When the host machine is switched to the playback mode, no recording signal is transmitted to transducer 10, and transistor 48 does not conduct so that switch 66 engages contact 68 and connects the playback amplifier with magnetic head 11. Signals picked up by playback head 11 in the accessory are then amplified by the playback amplifier and applied to transducer 10 for transmission back to the host machine which amplifies and plays back the signals through a speaker.

Figure 2:
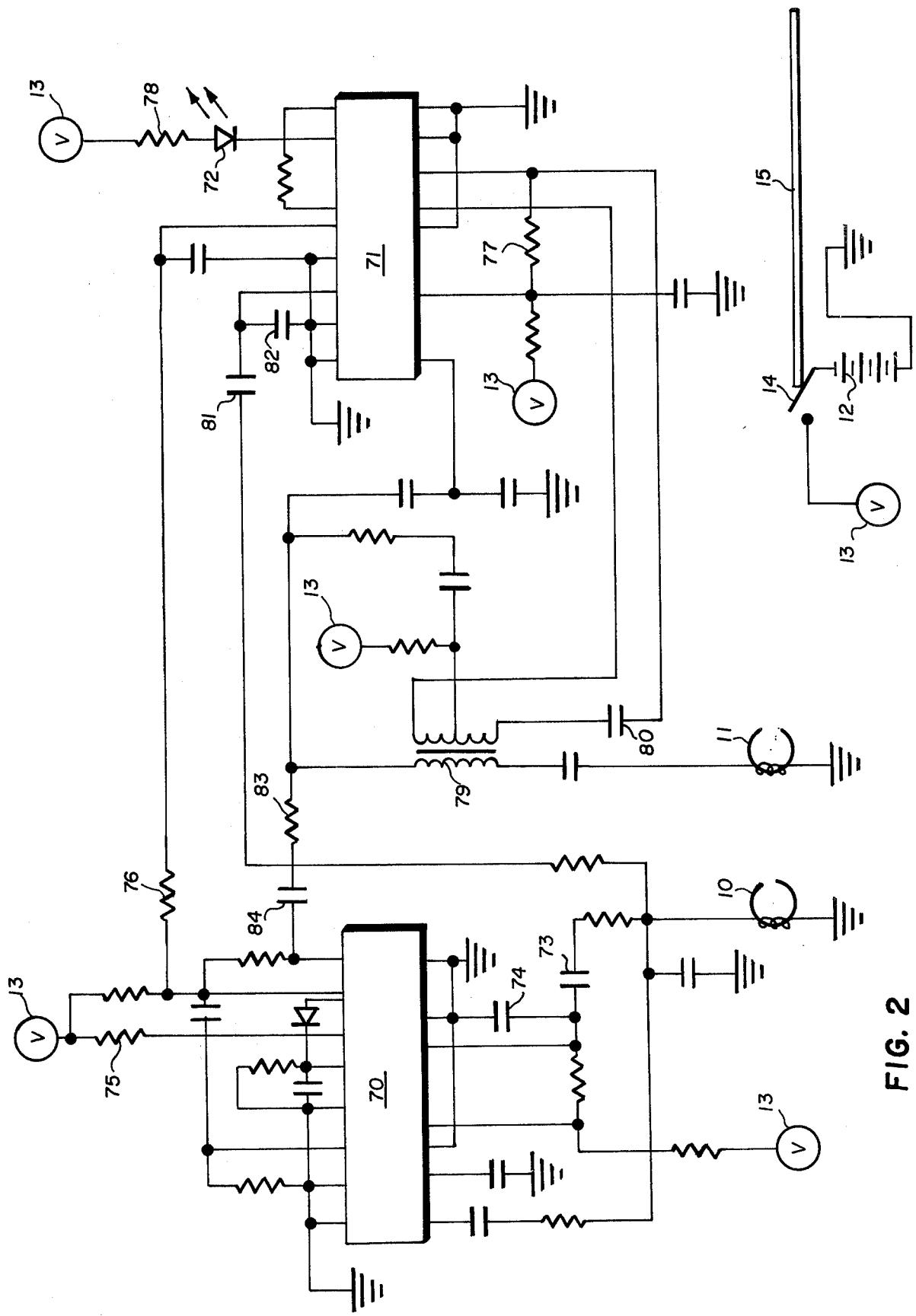

FIG. 2 shows another preferred embodiment of the inventive accessory circuitry arranged in a different way to accomplish the same functions. Integrated circuits 70 and 71 are used in place of some of the individual components of the circuitry of FIG. 1. Circuit 70 includes a playback amplifier and switching or trigger circuitry arranged for automatically changing the mode of the accessory circuitry to correspond with the mode of the host. Circuit 71 includes the record amplifier, an oscillator circuit for the bias recording signal, and a circuit for driving lamp 72 to provide a visual indication that the accessory is operating in the record mode.

Capacitors 73 and 74 are dimensioned to pass the bias portion of the recording signal received by transducer 10 to circuit 70 that includes a switching transistor. When the bias portion of a recording signal is received by transducer 10, it passes through capacitors 73 and 74 and is used to turn on a transistor in circuit 70 to increase the voltage drop at resistor 75, and this effectively turns off the playback amplifier in circuit 70. This also produces a lower voltage through resistor 76 to change the state of a transistor in circuit 71 to reduce the supply voltage drop in resistors 77 and 78 and bring about oscillation in transformer 79, capacitor 80, and a transistor in circuit 71. This causes light-emitting diode 72 to glow and give a visual indication that the accessory circuitry is in the record mode. It also applies a bias frequency signal to transformer 79 to which an amplified information portion of the recording signal is also applied for recording in the accessory with magnetic head 11. Capacitors 81 and 82 are dimensioned to pass an information portion of a recording signal received by transducer 10 into circuit 71 for amplification and application to magnetic head 11 via transformer 79.

In the playback mode of the host, no recording signal is received by transducer 10 so that circuit 70 switches to turn off the recording amplifier and oscillator and lamp driver of circuit 71 and to activate a playback amplifier in circuit 70. A playback signal received by magnetic head 11 is fed to the playback amplifier in circuit 70 via resistor 83 and capacitor 84 where the signal is amplified and transmitted to the host via transducer 10. Unnumbered resistors and capacitors in the circuitry of FIG. 2 are arranged for properly proportioning signals and for stabilizing components of the circuitry to keep the accessory in the proper mode and prevent any random or undesired switching or interference between components.

Figure 3:
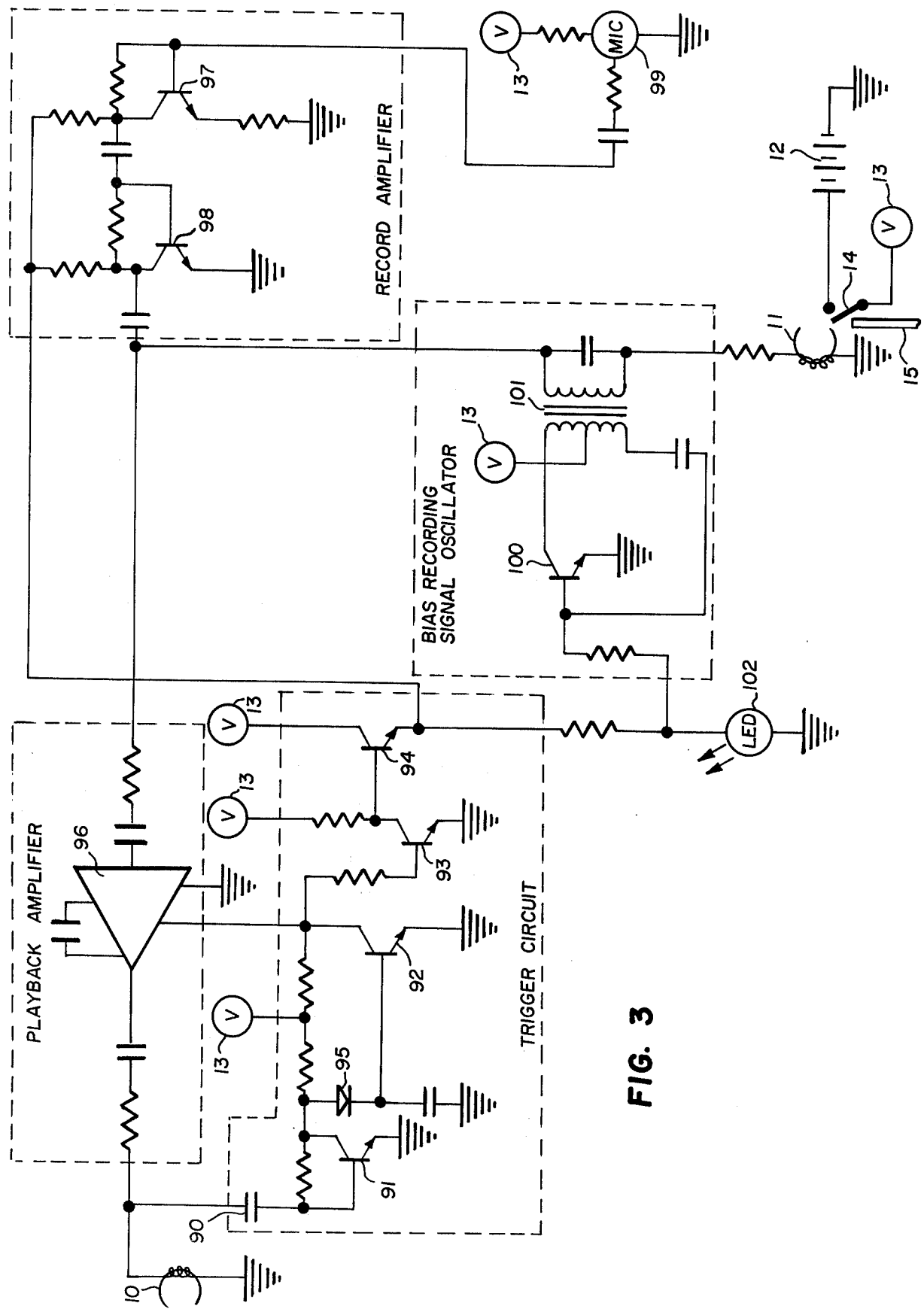

The circuitry embodiment of FIG. 3 is also preferred and is similar to the circuitry of FIG. 1, but is improved in eliminating the relay and making some simplifications and refinements, including the capacity for recording directly from a microphone connected to the accessory circuitry. Like the circuitry of FIG. 1, the circuitry of FIG. 3 includes a transducer 10 in a gap-to-gap communication with the magnetic recording head in a host recorder/player and a magnetic head 11 arranged in the accessory for recording and playback of a magnetic tape medium used by the accessory, such as a magnetic strip on a flat card 15. Battery 12 and card-activated switch 14 provide a voltage 13 applied to different points in the circuitry. The basic switching arrangement for the circuitry of FIG. 3 is generally the same, and the circuitry is divided into four main components as shown by broken line enclosures similar to FIG. 1.

The trigger circuit includes a capacitor 90 that is dimensioned to be somewhat selective in passing the bias frequency received from the host recorder via transducer 10 when the host recorder is in the record mode. The trigger circuit also includes four transistors 91-94 arranged to effect appropriate switching of the record and playback amplifiers and other components in the accessory circuitry. In addition to capacitors and resistors that are unnumbered and arranged in generally known ways, transistor 91 and diode 95 are arranged to supply transistor 92 with a sufficient DC signal derived from presence of a bias frequency from the host recorder as transmitted via capacitor 90. Presence of a bias frequency signal indicating that the host recorder/player is in the record mode then makes transistor 92 conductive, which effectively turns off operational amplifier 96 and deactivates the playback amplifier circuit. Conduction of transistor 92 also makes transistors 93 and 94 conductive, and this turns on the record amplifier circuit and energizes the bias recording signal oscillator circuit for automatically setting the accessory circuitry in the record mode matching the mode of the host recorder.

The record amplifier includes amplifying transistors 97 and 98 arranged in a generally known configuration, and the accessory circuitry of FIG. 3 includes a microphone 99 for receiving an information signal to be recorded in the accessory. Conduction of transistors 93 and 94, upon conduction of transistor 92, also energizes the bias recording signal oscillator circuit that includes an oscillating transistor 100 connected with transformer 101 to provide a bias oscillating frequency that facilitates recording in the accessory with recording head 11.

When the circuitry of FIG. 3 is in the record mode as described above, light-emitting diode 102 is energized to provide a visual indication to the operator that the accessory is functioning in the record mode and a recording can be made via microphone 99.

When no bias frequency signal is received from the host recorder via transducer 10, the transistors of the trigger circuit do not conduct and, therefore, do not turn on or energize the record amplifier or turn off operational amplifier 96 in the playback amplifier circuit. This also results in the bias recording signal oscillator being unenergized, and the circuitry of FIG. 3 is automatically set in a playback mode to conform to the playback mode of its host. Signals received by magnetic head 11 in the accessory are then amplified by the playback amplifier circuit including operational amplifier 96 and are delivered to transducer 10 for transmitting to the host recorder which further amplifies the signals to drive a speaker for playback purposes.

Use of the bias portion of the recording signal from the host recorder for automatic switching of the accessory is thus reliable, efficient, and economical in assuring that the accessory always conforms to the mode of operation of the host. Those skilled in the art will recognize ways that the disclosed circuitry can be modified by substitution of equivalent or alternative components for constructing accessories of different types for cooperating with different host machines.

What is claimed is:

1. Electric circuitry for an accessory for a host recorder and player, said accessory having a magnetic head for tape recording and playback and an electromagnetic transducer for sending and receiving electric signals to and from said host recorder and player, said circuitry comprising:

a. a recording amplifier arranged for amplifying an information signal and applying said amplified signal to said magnetic head for tape recording in said accessory;
   b. means for generating a recording bias signal and applying said recording bias signal to said magnetic head along with said amplified signal for tape recording in said accessory;
   c. a playback amplifier for receiving a playback signal from said magnetic head and amplifying said playback signal and applying said amplified playback signal to said transducer for transmission to said host recorder/player;
   d. switch means for switching said circuitry into a record mode and a playback mode, said switch means activating said recording amplifier and said generating means and deactivating said playback amplifier in said record mode and deactivating said recording amplifier and said generating means and activating said playback amplifier in said playback mode; and
   e. means for making said switching means responsive to a bias portion of a recording signal received from said host recorder/player via said transducer for switching said circuitry into said record mode when said bias portion of said recording signal from said host is received by said transducer and for switching said circuitry into said playback mode when said transducer is not receiving said bias portion of said recording signal.

2. The circuitry of claim 1 wherein said bias recording signal generating means includes an oscillating transistor and a transformer in circuit with said recording amplifier and said magnetic head.

3. The circuitry of claim 1 wherein said switching means includes means for connecting said magnetic head with said recording amplifier in said record mode, and means for connecting said magnetic head with said playback amplifier in said playback mode.

4. The circuitry of claim 3 wherein said bias recording signal generating means includes an oscillating transistor and a transformer in circuit with said recording amplifier and said magnetic head.

5. The circuitry of claim 1 wherein said accessory is arranged for using planar cards bearing tape and including a switch arranged to be actuated by presence of one of said cards in the region of said magnetic head for energizing said circuitry.

6. The circuitry of claim 5 wherein said bias recording signal generating means includes an oscillating transistor and a transformer in circuit with said recording amplifier and said magnetic head.

7. The circuitry of claim 5 wherein said switching means includes means for connecting said magnetic head with said recording amplifier in said record mode, and means for connecting said magnetic head with said playback amplifier in said playback mode.

8. The circuitry of claim 7 wherein said bias recording signal generating means includes an oscillating transistor and a transformer in circuit with said recording amplifier and said magnetic head.

9. The circuitry of claim 5 including an indicator and means for energizing said indicator when said circuitry is in said record mode.

10. The circuitry of claim 1 including an indicator and means for energizing said indicator when said circuitry is in said record mode.

11. The circuitry of claim 1 wherein said information signal is derived from an information portion of said recording signal from said host.

12. The circuitry of claim 1 wherein said accessory includes a microphone, and said information signal is derived from said microphone.

* * * * *